(12) United States Patent
Hsieh et al.

(10) Patent No.: US 8,836,383 B2
(45) Date of Patent: Sep. 16, 2014

(54) MULTIPURPOSE HALF BRIDGE SIGNAL OUTPUT CIRCUIT

(71) Applicants: Wei-Lun Hsieh, Kaohsiung (TW);
Hung-Sung Chu, Zhubei (TW);
Chung-Hsien Tso, Taipei (TW)

(72) Inventors: Wei-Lun Hsieh, Kaohsiung (TW);
Hung-Sung Chu, Zhubei (TW);
Chung-Hsien Tso, Taipei (TW)

(73) Assignee: Richtek Technology Corporation, Chupei, HsinChu (TW)

( * ) Notice: Subject to any disclaimer, the term of this patent is extended or adjusted under 35 U.S.C. 154(b) by 0 days.

(21) Appl. No.: 13/974,863

(22) Filed: Aug. 23, 2013

(65) Prior Publication Data

US 2014/0070870 A1 Mar. 13, 2014

Related U.S. Application Data

(60) Provisional application No. 61/698,533, filed on Sep. 7, 2012.

(51) Int. Cl.
*H03K 3/00* (2006.01)
*H03K 17/00* (2006.01)
*H03K 17/693* (2006.01)

(52) U.S. Cl.
CPC ............ *H03K 17/002* (2013.01); *H03K 17/693* (2013.01)

USPC ............ 327/108; 327/404; 327/333; 326/83; 326/30

(58) Field of Classification Search
USPC ............ 327/108–112, 403, 404, 333; 326/82, 326/83, 30

See application file for complete search history.

(56) References Cited

U.S. PATENT DOCUMENTS

| | | | | |
|---|---|---|---|---|
| 6,639,397 | B2 * | 10/2003 | Roth et al. | 324/750.01 |
| 6,700,823 | B1 * | 3/2004 | Rahman et al. | 365/189.05 |
| 7,884,653 | B2 * | 2/2011 | Chen et al. | 327/108 |
| 7,948,262 | B2 * | 5/2011 | Nguyen | 326/30 |
| 2011/0304356 | A1 * | 12/2011 | Kim et al. | 326/82 |

* cited by examiner

*Primary Examiner* — Lincoln Donovan
*Assistant Examiner* — Thomas Skibinski
(74) *Attorney, Agent, or Firm* — Tung & Associates (57) ABSTRACT

The present invention discloses a multipurpose half bridge signal output circuit. The multipurpose half bridge signal output circuit is capable of selectively operating under a charge sharing mode or a gate pulsing modulation mode. The multipurpose half bridge signal output circuit includes: a first output pin; a second output pin; a first circuit zone having a first common end coupled to the first output pin; and a second circuit zone having a second common end coupled to the second output pin.

6 Claims, 7 Drawing Sheets

First Voltage Adjustment Switch Q1 or Q3, or Second Voltage Adjustment Switch Q2 or Q4

Fig. 6A

First Voltage Adjustment Switch Q1 or Q3, or Second Voltage Adjustment Switch Q2 or Q4

Fig. 6B

MULTIPURPOSE HALF BRIDGE SIGNAL OUTPUT CIRCUIT

CROSS REFERENCE

The present invention claims priority to U.S. provisional application U.S. 61/698,533, filed on Sep. 7, 2012.

BACKGROUND OF THE INVENTION

1. Field of Invention

The present invention relates to a multipurpose half bridge signal output circuit; particularly, it relates to such multipurpose half bridge signal output circuit capable of selectively operating under a charge sharing mode or a gate pulsing modulation mode through different connection relationships among two output pins and one external resistor.

2. Description of Related Art

Figure 1:
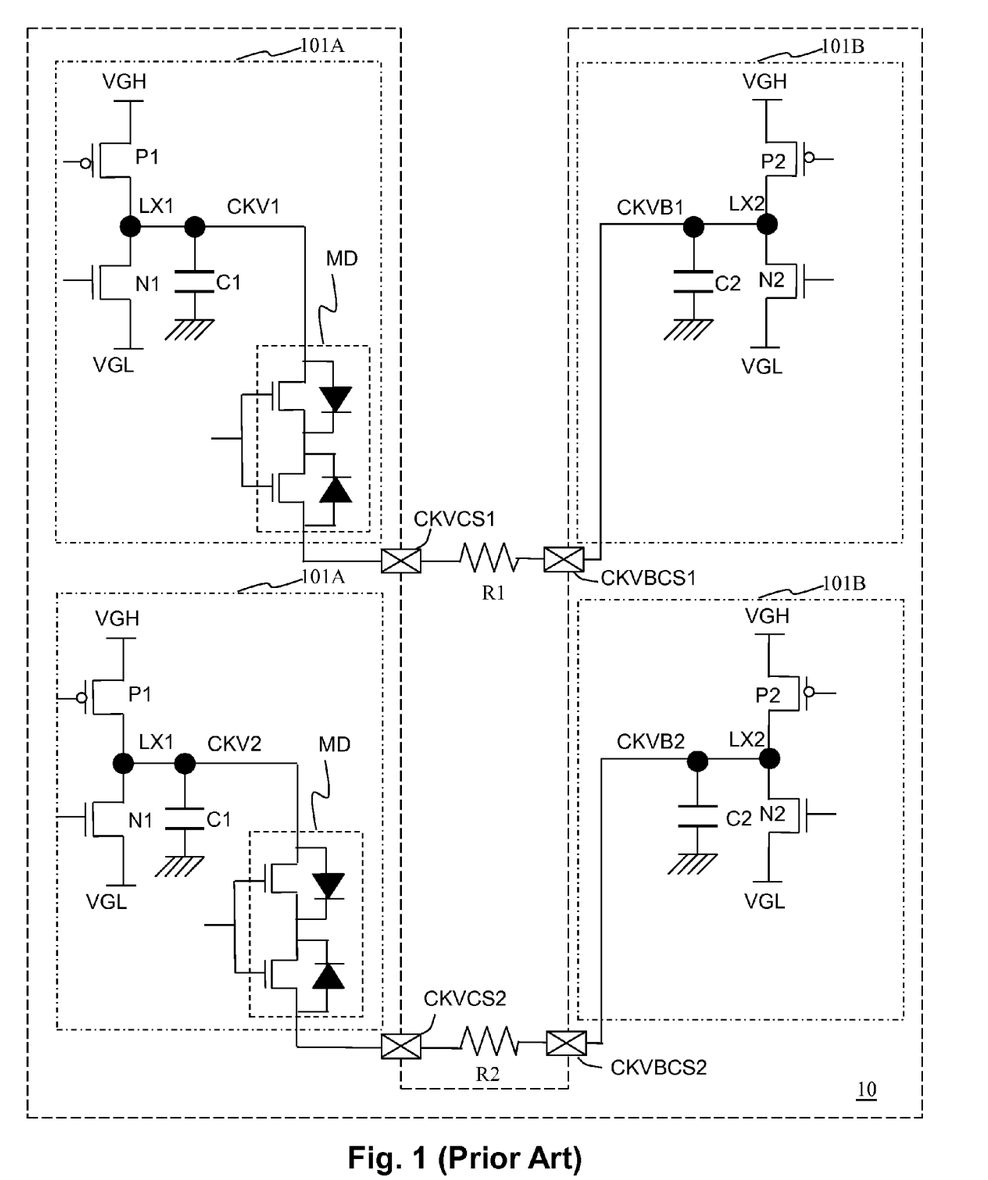
FIG. 1 shows a schematic diagram of a conventional half bridge signal output circuit for operating under a charge sharing mode.

Please refer to FIG. 1, which shows a schematic diagram of a conventional half bridge signal output circuit capable of operating under a charge sharing mode. As shown in FIG. 1, the conventional half bridge signal output circuit 10 is designed for operating under a charge sharing mode and it comprises plural half bridge signal output unit sets. Each of the half bridge signal output unit sets comprises a first half bridge signal output unit 101A and a second half bridge signal output unit 101B. For example, as shown in FIG. 1, two half bridge signal output unit sets are illustrated. Each first half bridge signal output unit 101A comprises a first high voltage switch P1, a first low voltage switch N1, a first capacitor C1 and a voltage adjustment switch MD. The first high voltage switch P1 has one end coupled to a high voltage source VGH and another end coupled to a first switching node LX1. The first low voltage switch N1 has one end coupled to a low voltage source VGL and another end coupled to the first switching node LX1. The first capacitor C1 has one end coupled to a first output terminal CKV1 (or CKV2). The voltage adjustment switch MD has one end coupled to the first output terminal CKV1 (or CKV2) and another end coupled to a first output pin CKVCS1 (or CKVCS2). Each second half bridge signal output unit 101B comprises a second high voltage switch P2, a second low voltage switch N2 and a second capacitor C2. The second high voltage switch P2 has one end coupled to the high voltage source VGH and another end coupled to a second switching node LX2. The second low voltage switch N2 has one end coupled to the low voltage source VGL and another end coupled to the second switching node LX2. The second capacitor C2 has one end coupled to a second output terminal CKVB1 (or CKVB2). The second output terminal CKVB1 (or CKVB2) has one end coupled to the second capacitor C2 and another end coupled to the second output pin CKVBCS1 (or CKVBCS2). The first output pin CKVCS1 is coupled to the second output pin CKVBCS1 through a resistor R1. The first output pin CKVCS2 is coupled to the second output pin CKVBCS2 through a resistor R2.

The following paragraph takes the first output voltage CKV1 and the second output voltage CKVB1 for example to explain how the conventional half bridge signal output circuit 10 operates under the charge sharing mode. Under normal operation, in one case, the first half bridge signal output unit 101A turns ON the first high voltage switch P1 and turns OFF the first low voltage switch N1, thereby outputting the first output voltage CKV1 having a voltage level equal to the high voltage source VGH. In the meantime, the second half bridge signal output unit 101B turns OFF the second high voltage switch P2 and turns ON the second low voltage switch N2, thereby outputting the second output voltage CKVB1 having a voltage level equal to the low voltage source VGL. Or, in another case, the first half bridge signal output unit 101A turns OFF the first high voltage switch P1 and turns ON the first low voltage switch N1, thereby outputting the first output voltage CKV1 having a voltage level equal to the low voltage source VGL. In the meantime, the second half bridge signal output unit 101B turns ON the second high voltage switch P2 and turns OFF the second low voltage switch N2, thereby outputting the second output voltage CKVB1 having a voltage level equal to the high voltage source VGH. In summary, the first output voltage CKV1 and the second output voltage CKVB1 are complementary to each other. When the conventional half bridge signal output circuit 10 operates under the charge sharing mode, the control signals (not shown) for controlling the first output voltage CKV1 and the second output voltage CKVB1 will turn ON the voltage adjustment switch MD of the first half bridge signal output unit 101A, and turn OFF the first high voltage switch P1, the first low voltage switch N1, the second high voltage switch P2 and the second low voltage switch N2. As a result, the two output terminals (i.e., the first output voltage CKV1 and the second output voltage CKVB1) are connected with each other through the resistor R1 and therefore can share charges. The details as to how charges are shared under the charge sharing mode are well known to those skilled in the art, which are not redundantly repeated here. The resistor R1 is for tuning the speed and slope of the charge sharing operation. That is, the charge sharing speed and the charge sharing slope can be adjusted by adjusting the resistance of the resistor R1.

In this prior art, in order to perform charge sharing function, it is required to provide one resistor and a pair of output pins (i.e., the first output pin CKVCS1 or CKVCS2 and the second output pin CKVBCS1 or CKVBCS2) for each of the half bridge signal output unit sets (i.e., each set of first half bridge signal output unit 101A and second half bridge signal output unit 101B). If there are more half bridge signal output unit sets, more resistors and output pins are required.

Figure 2:
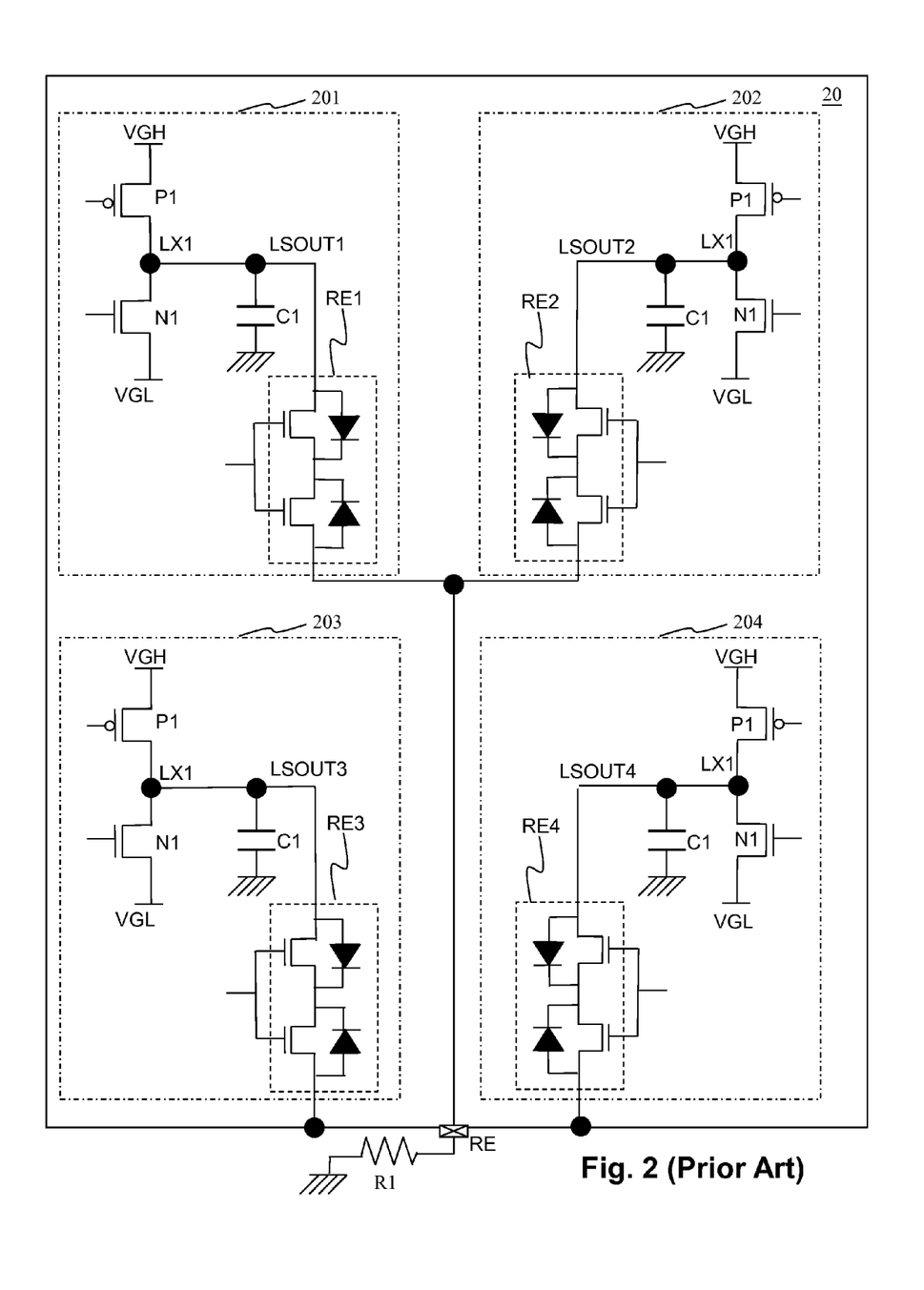
FIG. 2 shows a schematic diagram of a conventional half bridge signal output circuit for operating under a gate pulsing modulation mode.

Please refer to FIG. 2, which shows a schematic diagram of a conventional half bridge signal output circuit capable of operating under a gate pulsing modulation mode. As shown in FIG. 2, the conventional half bridge signal output circuit 20 is designed for operating under a gate pulsing modulation mode and it comprises plural half bridge signal output units 201~204. For example, as shown in FIG. 2, four half bridge signal output units 201~204 are illustrated. Each of the half bridge signal output units 201~204 comprises a high voltage switch P1, a low voltage switch N1, a capacitor C1 and a voltage adjustment switch RE1 (or RE2~RE4). The high voltage switch P1 has one end coupled to a high voltage source VGH and another end coupled to a switching node LX1. The low voltage switch N1 has one end coupled to a low voltage source VGL and another end coupled to the switching node LX1. The capacitor C1 has one end coupled to an output terminal LSOUT1 (or LSOUT2~LSOUT4). The voltage adjustment switch RE1 (or RE2~RE4) has one end coupled to the output terminal LSOUT1 (or LSOUT2~LSOUT4) and another end coupled to one single output pin RE. There is one resistor R1 disposed outside the conventional half bridge signal output circuit 20. The resistor R1 has one end coupled to the output pin RE and another end coupled to a middle voltage level between the high voltage source VGH and the low voltage source VGL. When the high voltage source VGH is a positive voltage and the low voltage source VGL is a negative voltage, the middle voltage level is for example the ground level.

The following paragraph takes the output voltage LSOUT1 for example to explain how the conventional half bridge signal output circuit 20 operates under the gate pulsing modulation mode. Under normal operation, in one case, the half bridge signal output unit 201 turns ON the high voltage switch P1 and turns OFF the low voltage switch N1, thereby outputting the output voltage LSOUT1 having a voltage level equal to the high voltage source VGH. Or, in another case, the half bridge signal output unit 201 turns OFF the high voltage switch P1 and turns ON the low voltage switch N1, thereby outputting the output voltage LSOUT1 having a voltage level equal to the low voltage source VGL. When it is required for the output voltage LSOUT1 to switch between the high level and the low level, the half bridge signal output unit 201 will first control the output voltage LSOUT1 to reach a middle level between the high level and the low level, and then control the output voltage LSOUT1 to switch to its target level. This is the so-called "gate pulsing modulation". When the conventional half bridge signal output circuit 20 operates under the gate pulsing modulation mode, the control signals (not shown) for controlling the output voltage LSOUT1 will turn ON the voltage adjustment switch RE1 of the half bridge signal output unit 201 and turn OFF the high voltage switch P1 and the low voltage switch N1 of the half bridge signal output unit 201. In the meantime, the control signals (not shown) for the other output voltages LSOUT2~LSOUT4 will turn OFF the voltage adjustment switch RE2~RE4 of the half bridge signal output unit 202~204. Thus, the output voltage LSOUT1 first reaches the middle voltage level (e.g., the ground level). After that, the voltage adjustment switch RE1 is turned OFF and the high voltage switch P1 or the low voltage switch N1 of the half bridge signal output unit 201 is turned ON, so that the output voltage LSOUT1 will switch to its target level. The details as to how to perform gate pulsing modulation are well known to those skilled in the art, which are not redundantly repeated here. The resistor R1 is for tuning the speed and the slope of the gate pulsing modulation. That is, the speed and the slope of the gate pulsing modulation can be adjusted by adjusting the resistance of the resistor R1.

The drawback of the two above-mentioned prior art circuits is that: they can perform only one single function. The prior art of FIG. 1 can only perform charging sharing operation but cannot perform gate pulsing modulation operation. The prior art of FIG. 2 can only perform gate pulsing modulation operation but cannot perform charging sharing operation.

In view of the above, to overcome the drawbacks in the prior art, the present invention proposes a multipurpose half bridge signal output circuit capable of selectively operating under a charge sharing mode or a gate pulsing modulation mode through different connection relationships among two output pins and one external resistor.

SUMMARY OF THE INVENTION

An objective of the present invention is to provide a multipurpose half bridge signal output circuit.

To achieve the above and other objectives, from one perspective, the present invention provides a multipurpose half bridge signal output circuit, for selectively operating under a charge sharing mode or a gate pulsing modulation mode, the multipurpose half bridge signal output circuit comprising: a first output pin; a second output pin; a first circuit zone including a plurality of first half bridge signal output circuits, wherein the outputs of the plurality of first half bridge signal output circuits are commonly coupled to the first output pin; and a second circuit zone including a plurality of second half bridge signal output circuits, wherein the outputs of the plurality of second half bridge signal output circuits are commonly coupled to the second output pin.

In one embodiment, each of the first half bridge signal output circuits includes: a first half bridge switch set having a first high voltage switch and a first low voltage switch, wherein the first high voltage switch has one end coupled to a high voltage source and another end coupled to a first switching node, and the first low voltage switch has one end coupled to a low voltage source and another end coupled to the first switching node; a first capacitor having one end coupled to the first switching node; and a first voltage adjustment switch having one end coupled to the first switching node and another end coupled to the first output pin; and each of the second half bridge signal output circuits includes: a second half bridge switch set having a second high voltage switch and a second low voltage switch, wherein the second high voltage switch has one end coupled to the high voltage source and another end coupled to a second switching node, and the second low voltage switch has one end coupled to the low voltage source and another end coupled to the second switching node; a second capacitor having one end coupled to the second switching node; and a second voltage adjustment switch having one end coupled to the second switching node and another end coupled to the second output pin.

In one embodiment, the multipurpose half bridge signal output circuit further comprises: a resistor, wherein the resistor is selectively coupled by one of the two following connections: (1) the resistor being coupled between the first output pin and the second output pin; or (2) the resistor having one end coupled with a common node where the first output pin and the second output pin are both electrically connected with, and another end coupled to a middle voltage level between a high voltage source and a low voltage source; wherein: when the resistor is coupled between the first output pin and the second output pin, the multipurpose half bridge signal output circuit operates under the charge sharing mode; and when the resistor has one end one end coupled with a common node where the first output pin and the second output pin are both electrically connected with, and another end coupled to the middle voltage level between the high voltage source and the low voltage source, the multipurpose half bridge signal output circuit operates under the gate pulsing modulation mode. The first circuit zone and the second circuit zone can be integrated in an integrated circuit chip and the resistor can be an external device with respect to the integrated circuit chip.

In one embodiment, each of the first voltage adjustment switches includes two transistor switches, and each of the two transistor switches has a parasitic diode whose polarity is opposite to a polarity of a parasitic diode of the other transistor switch; or each of the first voltage adjustment switches includes a transistor switch having a parasitic diode whose polarity is adjustable.

In one embodiment, each of the second voltage adjustment switches includes two transistor switches, and each of the two transistor switches has a parasitic diode whose polarity is opposite to a polarity of a parasitic diode of the other transistor switch; or each of the second voltage adjustment switches includes a transistor switch having a parasitic diode whose polarity is adjustable.

The objectives, technical details, features, and effects of the present invention will be better understood with regard to the detailed description of the embodiments below, with reference to the attached drawings.

DESCRIPTION OF THE PREFERRED EMBODIMENTS

The above and other technical details, features and effects of the present invention will be will be better understood with regard to the detailed description of the embodiments below, with reference to the drawings. In the description, the words relate to directions such as "upper", "lower", "left", "right", "forward", "backward", etc. are used to illustrate relative orientations in the drawings and should not be considered as limiting in any way. The drawings as referred to throughout the description of the present invention are for illustration only, to show the interrelations between the circuit and the devices, but not drawn according to actual scale.

Figure 3:
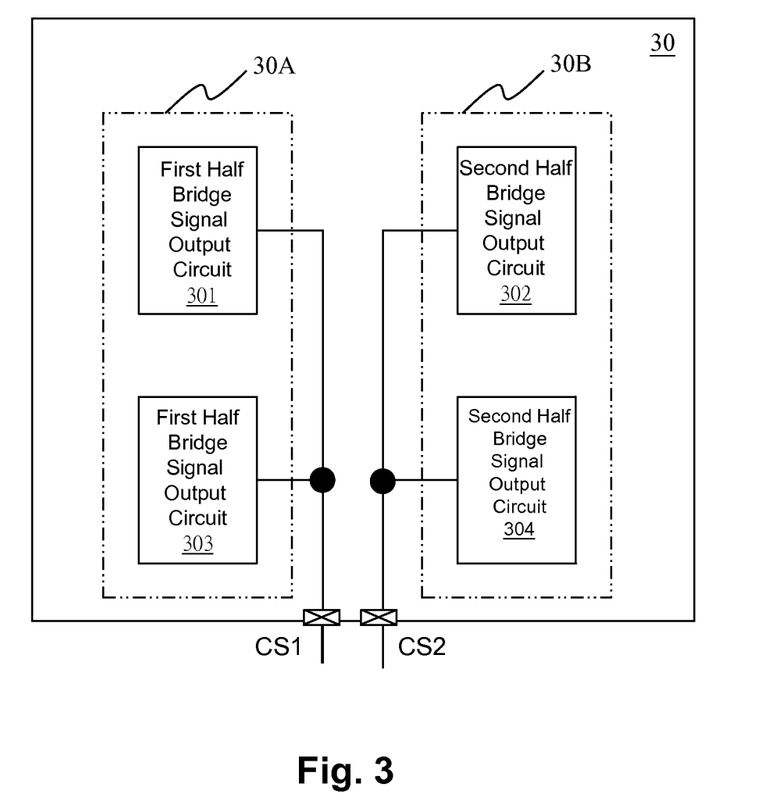
FIG. 3 shows a block diagram of a multipurpose half bridge signal output circuit according to an embodiment of the present invention.

Please refer to FIG. 3, which shows a block diagram of a multipurpose half bridge signal output circuit according to an embodiment of the present invention. The multipurpose half bridge signal output circuit 30 comprises a first circuit zone 30A, a second circuit zone 30B, a first output pin CS1 and a second output pin CS2. The first circuit zone 30A has a common end coupled to the first output pin CS1 of the multipurpose half bridge signal output circuit 30. The second circuit zone 30B has a common end coupled to the second output pin CS2 of the multipurpose half bridge signal output circuit 30. The internal circuit structures of the first circuit zone 30A and the second circuit zone 30B are shown in FIG. 4.

Figure 4:
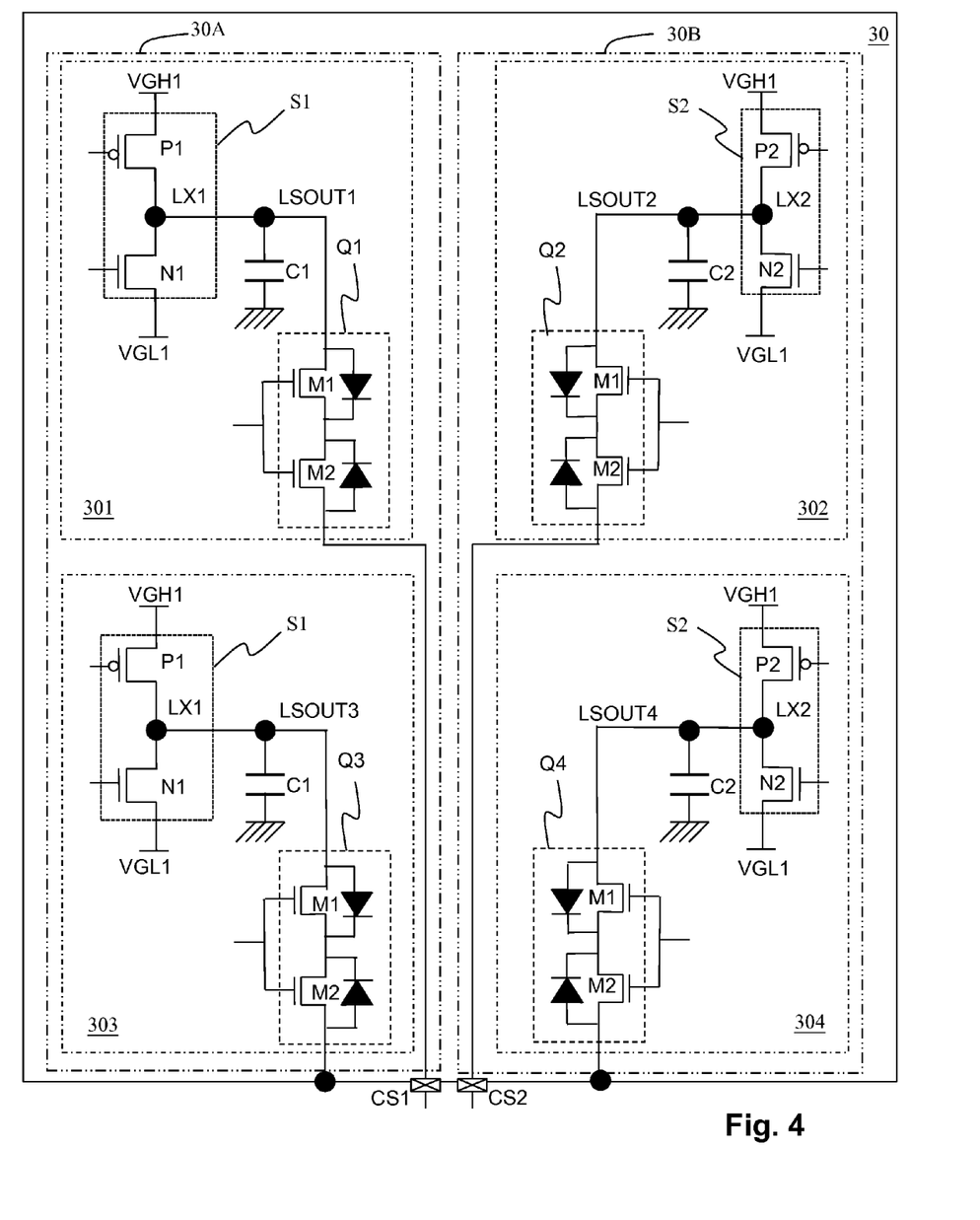
FIG. 4 shows a schematic diagram of a multipurpose half bridge signal output circuit according to an embodiment of the present invention.

Please refer to FIG. 4, which shows a schematic diagram of a multipurpose half bridge signal output circuit according to an embodiment of the present invention. The first circuit zone 30A comprises plural first half bridge signal output circuits 301 and 303. For example, as shown in FIG. 4, two first half bridge signal output circuits 301 and 303 are illustrated. Note that the number of the first half bridge signal output circuit in this embodiment is for illustrative purpose, but not for limiting the scope of the present invention. Each of the first half bridge signal output circuit 301 or 303 comprises a first half bridge switch set S1, a first capacitor C1 and a first voltage adjustment switch Q1 or Q3. The first half bridge switch set S1 has a first high voltage switch P1 and a first low voltage switch N1. The first high voltage switch P1 has one end coupled to a high voltage source VGH1 and another end coupled to a first switching node LX1. The first low voltage switch N1 has one end coupled to a low voltage source VGL1 and another end coupled to the first switching node LX1. One end (hereinafter "the first output terminal") of the first capacitor C1 is coupled to the first switching node LX1. The first output terminal generates the first output voltage LSOUT1 or LSOUT3. The first voltage adjustment switch Q1 (or Q3) has one end coupled to the first switching node LX1 to receive the first output voltage LSOUT1 (or LSOUT3) and another end coupled to the first output pin CS1. That is, in the first circuit zone 30A, each of the first half bridge signal output circuits 301 or 303 generates an output signal in the form of a voltage signal (LSOUT1 or LSOUT3) at the first output terminal. The first output terminal of the first half bridge signal output circuit 301 and the first output terminal of the first half bridge signal output circuit 303 are commonly coupled to the first output pin CS1 through the first voltage adjustment switch Q1 and the first voltage adjustment switch Q3, respectively.

The second circuit zone 30B comprises plural second half bridge signal output circuits 302 and 304. For example, as shown in FIG. 4, two second half bridge signal output circuits 302 and 304 are illustrated. Note that the number of the second half bridge signal output circuit in this embodiment is for illustrative purpose, but not for limiting the scope of the present invention. Each of the second half bridge signal output circuit 302 or 304 comprises a second half bridge switch set S2, a second capacitor C2 and a second voltage adjustment switch Q2 or Q4. The second half bridge switch set S2 has a second high voltage switch P2 and a second low voltage switch N2. The second high voltage switch P2 has one end coupled to the high voltage source VGH1 and another end coupled to a second switching node LX2. The second low voltage switch N1 has one end coupled to the low voltage source VGL1 and another end coupled to the second switching node LX2. One end (hereinafter "the second output terminal") of the second capacitor C2 is coupled to the second switching node LX2. The second output terminal generates the second output voltage LSOUT2 or LSOUT4. The second voltage adjustment switch Q2 (or Q4) has one end coupled to the second switching node LX2 to receive the second output voltage LSOUT2 (or LSOUT4) and another end coupled to the second output pin CS2. That is, in the second circuit zone 30B, each of the second half bridge signal output circuits 302 or 304 generates an output signal in the form of a voltage signal (LSOUT2 or LSOUT4) at the second output terminal. The second output terminal of the second half bridge signal output circuit 302 and the second output terminal of the second half bridge signal output circuit 304 are commonly coupled to the second output pin CS2 through the second voltage adjustment switch Q2 and the second voltage adjustment switch Q4, respectively.

In one embodiment, each of the first high voltage switches P1 and second high voltage switches P2 is a PMOS transistor. Each of the first low voltage switches N1 and second low voltage switches N2 is an NMOS transistor. Note that the above-mentioned embodiment is only an illustrative example, but not for limiting the scope of the present invention. It is also practicable and within the scope of the present invention that the high voltage switches and low voltage switches are other types of transistors.

Figure 5A:
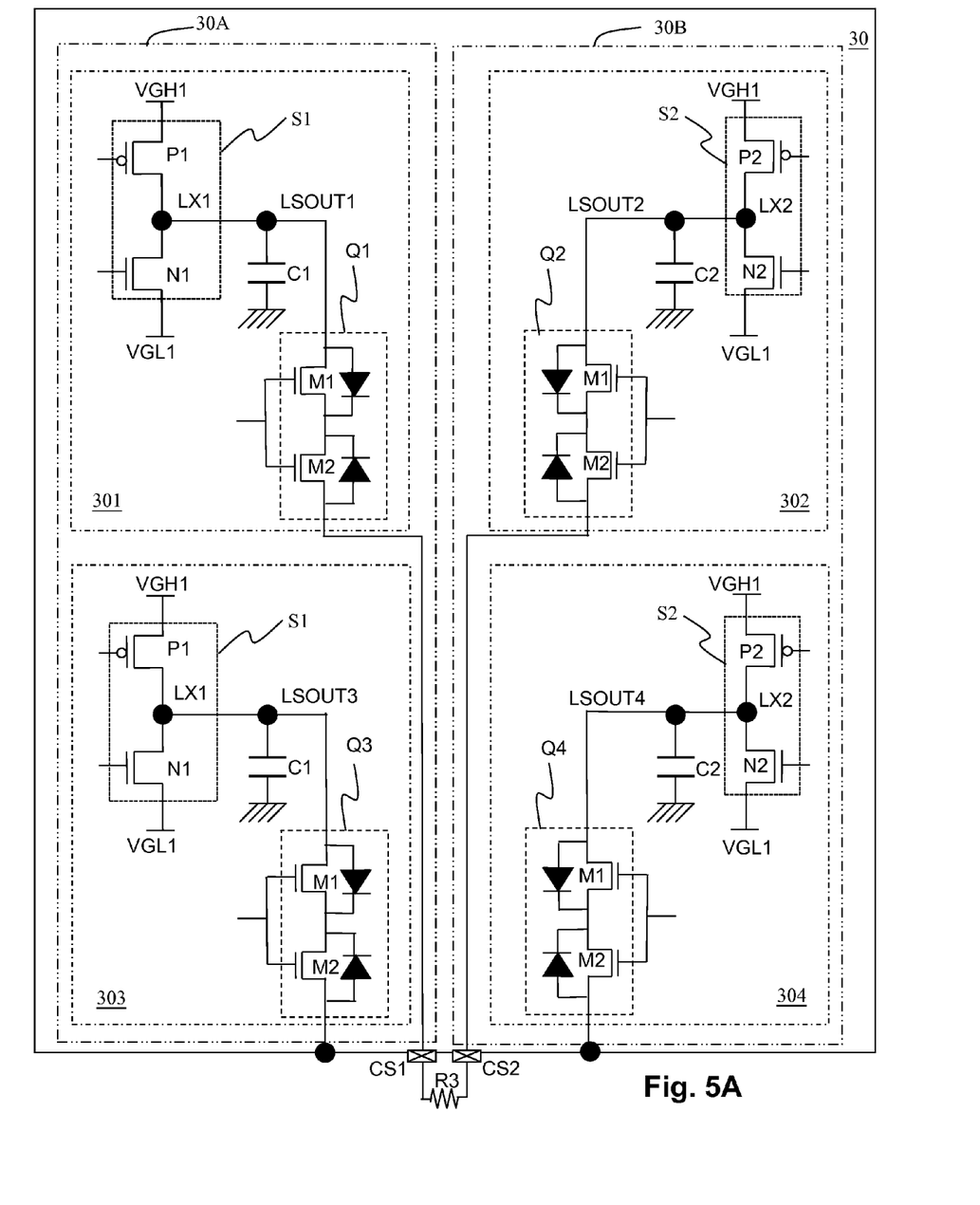
FIG. 5A illustrates how the multipurpose half bridge signal output circuit of the present invention operates under a charge sharing mode.
Figure 5B:
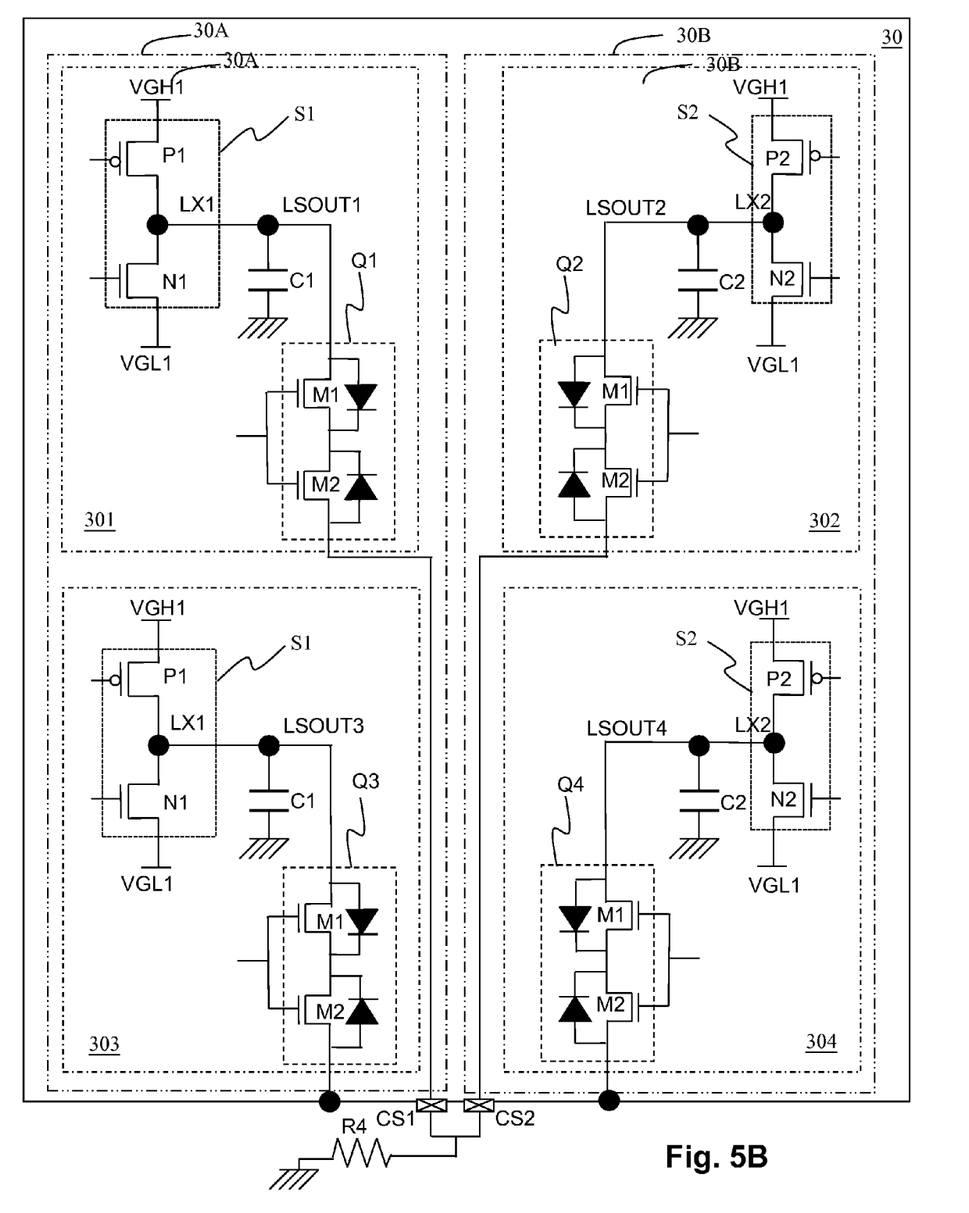
FIG. 5B illustrates how the multipurpose half bridge signal output circuit of the present invention operates under a gate pulsing modulation mode.

FIGS. 5A-5B illustrates how the multipurpose half bridge signal output circuit 30 selectively operates under the charge sharing mode or the gate pulsing modulation mode through different connection relationships among two output pins (i.e., the first output pin CS1 and the second output pin CS2) and one external resistor.

FIG. 5A illustrates how the multipurpose half bridge signal output circuit of the present invention operates under the charge sharing mode. As shown in FIG. 5A, when it is desired for the multipurpose half bridge signal output circuit 30 to operate under the charge sharing mode, a resistor R3 can be coupled between the first output pin CS1 and the second output pin CS2, whereby the multipurpose half bridge signal output circuit 30 of this embodiment will operate under the charge sharing mode. Let us take the first output voltage LSOUT1 and the second output voltage LSOUT2 for example to explain how the multipurpose half bridge signal output circuit 30 operates under the charge sharing mode. When the multipurpose half bridge signal output circuit 30 of this embodiment operates under the charge sharing mode, the control signals (not shown) for controlling the first output voltage LSOUT1 and the second output voltage LSOUT2 will turn ON the first voltage adjustment switch Q1 of the first half bridge signal output circuit 301 and the second voltage adjustment switch Q2 of the second half bridge signal output circuit 302, and turn OFF the first high voltage switch P1 and the first low voltage switch N1 of the first half bridge signal output circuit 301, the second high voltage switch P2 and the second low voltage switch N2 of the second half bridge signal output circuit 302, the first voltage adjustment switch Q3 of the first half bridge signal output circuit 303, the second voltage adjustment switch Q4 of the second half bridge signal output circuit 304, the first high voltage switch P1 and the first low voltage switch N1 of the first half bridge signal output circuit 303, and the second high voltage switch P2 and the second low voltage switch N2 of the second half bridge signal output circuit 304. As a result, the two terminals of the resistor R3 (i.e., the first output voltage LSOUT1 and the second output voltage LSOUT2) can share charges. For example, assuming that the first output voltage LSOUT1 is at a high voltage level and the second output voltage LSOUT2 is at a low voltage level, when the charging sharing operation is completed and the charges are balanced, the first output voltage LSOUT1 and the second output voltage LSOUT2 will be at a middle voltage level between the high voltage level and the low voltage level. The details as to how charges are shared under the charge sharing mode are well known to those skilled in the art, which are not redundantly repeated here. The resistor R3 is for tuning the speed and slope for the charging sharing operation. That is, the charging sharing speed and the charging sharing slope can be adjusted by adjusting the resistance of the resistor R3. The resistance of the resistor R3 can be decided as desired.

Please refer to FIG. 5B, which illustrates how the multipurpose half bridge signal output circuit of the present invention operates under the gate pulsing modulation mode. As shown in FIG. 5B, when it is desired for the multipurpose half bridge signal output circuit 30 to operate under the gate pulsing modulation mode, the first output pin CS1 and the second output pin CS2 can be coupled to each other, and an external resistor R4 can be coupled to the common node where both the first output pin CS1 and the second output pin CS2 are coupled to. The other end of the external resistor R4 can be coupled to a middle voltage level between the high voltage source VGH1 and the low voltage source VGL1, whereby the multipurpose half bridge signal output circuit 30 operates under the gate pulsing modulation mode. When the high voltage source VGH1 is a positive voltage and the low voltage source VGL1 is a negative voltage, the middle voltage is, for example, a ground level. Let us take the first output voltage LSOUT1 for example to explain how the multipurpose half bridge signal output circuit 30 operates under the gate pulsing modulation mode. When the multipurpose half bridge signal output circuit of this embodiment operates under the gate pulsing modulation mode, the control signals (not shown) for controlling the first output voltage LSOUT1 turn OFF the first high voltage switch P1 and the first low voltage switch N1 of the first half bridge signal output circuit 301, and turn ON the first voltage adjustment switch Q1 of the first half bridge signal output circuit 301. In the meantime, the control signals (not shown) for controlling the other output voltage LSOUT2~LSOUT4 will turn OFF the first voltage adjustment switch Q3 of the first half bridge signal output circuit 303, the second voltage adjustment switch Q2 of the second half bridge signal output circuit 302, and the second voltage adjustment switch Q4 of the second half bridge signal output circuit 304. As a result, the output voltage LSOUT1 will reach the middle voltage level (e.g., the ground level). After that, the first voltage adjustment switch Q1 is turned OFF and the first high voltage switch P1 or the first low voltage switch N1 of the first half bridge signal output circuit 301 is turned ON, so that the first output voltage LSOUT1 will switch to its target level, completing the "gate pulsing modulation" operation. The details as to how to perform gate pulsing modulation are well known to those skilled in the art, which are not redundantly repeated here. The resistor R4 is for tuning the speed and the slope of the gate pulsing modulation operation. That is, the speed and the slope of the gate pulsing modulation can be adjusted by adjusting the resistance of the resistor R4. The resistance of the resistor R4 can be decided as desired.

Figure 6A:
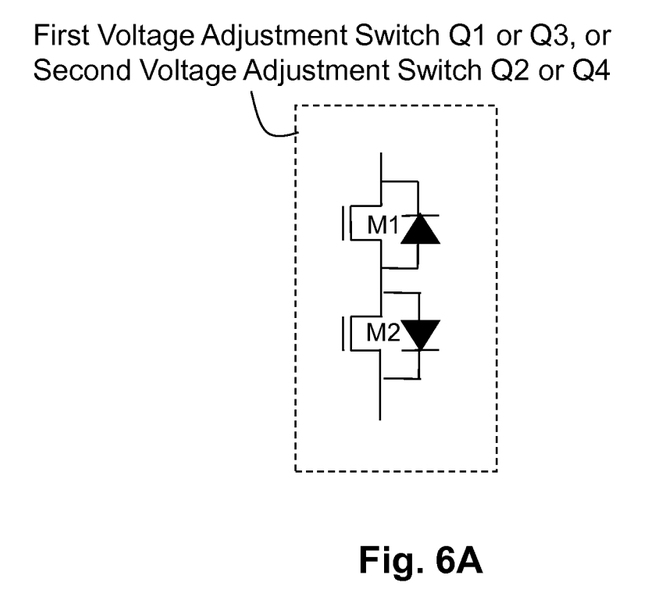
FIGS. 6A-6B show several embodiments of the first voltage adjustment switch and the second voltage adjustment switch.
Figure 6B:
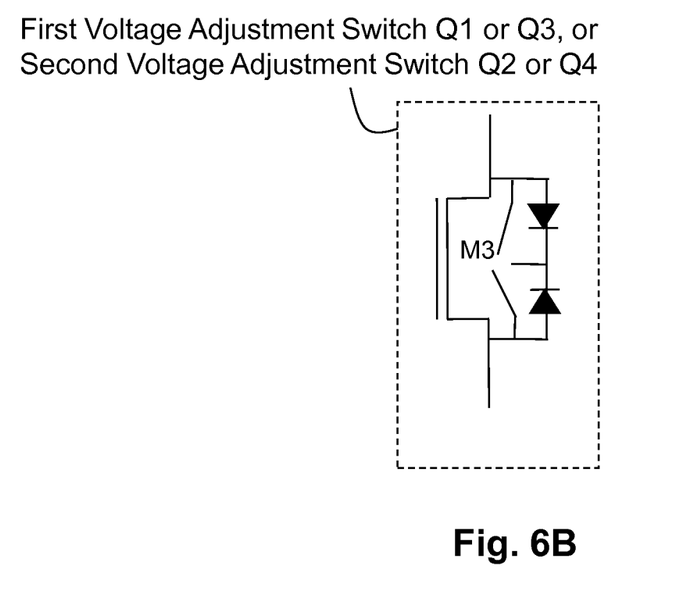

In this embodiment, each of the first voltage adjustment switches Q1 and Q3 and the second voltage adjustment switches Q2 and Q4 comprises two transistor switches M1 and M2. Each of the two transistor switches M1 and M2 has a parasitic diode whose polarity is opposite to a polarity of a parasitic diode of the other transistor switch, as shown in FIG. 4 and FIGS. 5A-5B. In other embodiments, the first voltage adjustment switches Q1 and Q3 and the second voltage adjustment switches Q2 and Q4 can also be replaced by the structure shown in FIGS. 6A-6B. FIG. 6B shows a transistor switch M3 having a parasitic diode whose polarity is adjustable.

The present invention provides the following advantages. Through different connection relationships among two output pins (i.e., the first output pin CS1 and the second output pin CS2) and one external resistor, the present invention can selectively operate under a charge sharing mode or a gate pulsing modulation mode. Hence, the circuit application is more flexible (in application, an internal control circuit can be designed to be capable of providing control signals for both of the operation modes). Second, as compared with the first prior art mentioned above, the present invention requires less output pins, which is more cost-effective.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, a device or circuit which does not affect the primary meaning of a signal can be inserted by any two devices or circuits shown to be in direct connection, such as a switch or the like. In view of the foregoing, the spirit of the present invention should cover all such and other modifications and variations, which should be interpreted to fall within the scope of the following claims and their equivalents.

What is claimed is:

1. A multipurpose half bridge signal output circuit for selectively operating under a charge sharing mode or a gate pulsing modulation mode, the multipurpose half bridge signal output circuit comprising:
   - a first output pin;
   - a second output pin;
   - a first circuit zone including a plurality of first half bridge signal output circuits, wherein outputs of the plurality of first half bridge signal output circuits are commonly coupled to the first output pin; and
   - a second circuit zone including a plurality of second half bridge signal output circuits, wherein outputs of the plurality of second half bridge signal output circuits are commonly coupled to the second output pin, wherein the multipurpose half bridge signal output circuit selectively operates under the charge sharing mode or the gate pulsing modulation mode through a change in a connection relationship among the first output pin, the second output pin and resistor.

2. The multipurpose half bridge signal output circuit of claim 1, wherein:
   each of the first half bridge signal output circuits includes:
   - a first half bridge switch set having a first high voltage switch and a first low voltage switch, wherein the first high voltage switch has one end coupled to a high voltage source and another end coupled to a first switching node, and the first low voltage switch has one end coupled to a low voltage source and another end coupled to the first switching node;
   - a first capacitor having one end coupled to the first switching node; and
   - a first voltage adjustment switch having one end coupled to the first switching node and another end coupled to the first output pin; and
   each of the second half bridge signal output circuits includes:
   - a second half bridge switch set having a second high voltage switch and a second low voltage switch, wherein the second high voltage switch has one end coupled to the high voltage source and another end coupled to a second switching node, and the second low voltage switch has one end coupled to the low voltage source and another end coupled to the second switching node;
   - a second capacitor having one end coupled to the second switching node; and
   - a second voltage adjustment switch having one end coupled to the second switching node and another end coupled to the second output pin.

3. The multipurpose half bridge signal output circuit of claim 1,
   wherein the connection relationship among the first output pin, the second output pin and the resistor is selectively achieved by one of the two following connections: (1) the resistor being coupled between the first output pin and the second output pin; or (2) the resistor having one end coupled with a common node where the first output pin and the second output pin are both electrically connected with, and another end coupled to a middle voltage level between a high voltage source and a low voltage source;
   wherein:
   when the resistor is coupled between the first output pin and the second output pin, the multipurpose half bridge signal output circuit operates under the charge sharing mode; and
   when the resistor has one end one end coupled with a common node where the first output pin and the second output pin are both electrically connected with, and another end coupled to the middle voltage level between the high voltage source and the low voltage source, the multipurpose half bridge signal output circuit operates under the gate pulsing modulation mode.

4. The multipurpose half bridge signal output circuit of claim 3, wherein the first circuit zone and the second circuit zone are integrated in an integrated circuit chip and the resistor is an external device with respect to the integrated circuit chip.

5. The multipurpose half bridge signal output circuit of claim 2, wherein:
   each of the first voltage adjustment switches includes two transistor switches, and each of the two transistor switches has a parasitic diode whose polarity is opposite to a polarity of a parasitic diode of the other transistor switch; or
   each of the first voltage adjustment switches includes a transistor switch having a parasitic diode whose polarity is adjustable.

6. The multipurpose half bridge signal output circuit of claim 2, wherein:
   each of the second voltage adjustment switches includes two transistor switches, and each of the two transistor switches has a parasitic diode whose polarity is opposite to a polarity of a parasitic diode of the other transistor switch; or
   each of the second voltage adjustment switches includes a transistor switch having a parasitic diode whose polarity is adjustable.

* * * * *